(12) United States Patent
Jensen et al.

(10) Patent No.: US 9,006,069 B2
(45) Date of Patent: Apr. 14, 2015

(54) PULSED LASER ANNEAL PROCESS FOR TRANSISTORS WITH PARTIAL MELT OF A RAISED SOURCE-DRAIN

(75) Inventors: Jacob Jensen, Beaverton, OR (US); Tahir Ghani, Portland, OR (US); Mark Y. Liu, West Linn, OR (US); Harold Kennel, Portland, OR (US); Robert James, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,822

(22) PCT Filed: Dec. 19, 2011

(86) PCT No.: PCT/US2011/065910
§ 371 (c)(1),
(2), (4) Date: Jun. 27, 2013

(87) PCT Pub. No.: WO2013/095340
PCT Pub. Date: Jun. 27, 2013

(65) Prior Publication Data
US 2013/0285129 A1 Oct. 31, 2013

(51) Int. Cl.
*H01L 21/268* (2006.01)
*H01L 29/66* (2006.01)
*H01L 29/78* (2006.01)
*H01L 21/265* (2006.01)

(52) U.S. Cl.
CPC ............ *H01L 29/785* (2013.01); *H01L 21/268* (2013.01); *H01L 29/66628* (2013.01); *H01L 29/66795* (2013.01); *H01L 21/26506* (2013.01)

(58) Field of Classification Search
CPC ............ H01L 21/268; H01L 29/66628; H01L 29/785; H01L 21/26506; H01L 29/66795
See application file for complete search history.

(56) References Cited

U.S. PATENT DOCUMENTS

| | | | |
|---|---|---|---|
| 6,680,250 B1 * | 1/2004 | Paton et al. | 438/660 |
| 7,795,101 B2 * | 9/2010 | Wang et al. | 438/305 |
| 2004/0099903 A1 | 5/2004 | Yeo et al. | |
| 2004/0219722 A1 | 11/2004 | Pham et al. | |
| 2006/0014366 A1 * | 1/2006 | Currie | 438/517 |
| 2006/0084204 A1 | 4/2006 | Yin et al. | |
| 2006/0157797 A1 * | 7/2006 | Tateshita | 257/369 |

(Continued)

OTHER PUBLICATIONS

International Search Report and Written Opinion mailed Dec. 19, 2011 for PCT/US2011/065910 filed Dec. 19, 2011, 9 pages.

*Primary Examiner* — Jarrett Stark
*Assistant Examiner* — Bitew Dinke
(74) *Attorney, Agent, or Firm* — Blakely, Sokoloff, Taylor & Zafman LLP

(57) ABSTRACT

A non-planar transistor including partially melted raised semiconductor source/drains disposed on opposite ends of a semiconductor fin with the gate stack disposed there between. The raised semiconductor source/drains comprise a super-activated dopant region above a melt depth and an activated dopant region below the melt depth. The super-activated dopant region has a higher activated dopant concentration than the activated dopant region and/or has an activated dopant concentration that is constant throughout the melt region. A fin is formed on a substrate and a semiconductor material or a semiconductor material stack is deposited on regions of the fin disposed on opposite sides of a channel region to form raised source/drains. A pulsed laser anneal is performed to melt only a portion of the deposited semiconductor material above a melt depth.

17 Claims, 16 Drawing Sheets

(56) References Cited

U.S. PATENT DOCUMENTS

| | | | |
|---|---|---|---|
| 2008/0237661 A1* | 10/2008 | Ranade et al. | 257/288 |
| 2009/0090982 A1* | 4/2009 | Ranade et al. | 257/408 |
| 2010/0297816 A1 | 11/2010 | Bedell et al. | |
| 2011/0037125 A1* | 2/2011 | Cheng et al. | 257/351 |
| 2011/0042744 A1* | 2/2011 | Cheng et al. | 257/347 |
| 2011/0068396 A1* | 3/2011 | Cheng et al. | 257/335 |
| 2011/0073952 A1* | 3/2011 | Kwok et al. | 257/368 |
| 2011/0147828 A1* | 6/2011 | Murthy et al. | 257/327 |
| 2011/0309333 A1* | 12/2011 | Cheng et al. | 257/24 |
| 2012/0187505 A1* | 7/2012 | Guo et al. | 257/401 |
| 2012/0313168 A1* | 12/2012 | Cheng et al. | 257/347 |
| 2013/0149829 A1* | 6/2013 | Nandakumar | 438/294 |
| 2013/0161697 A1* | 6/2013 | Ponoth et al. | 257/192 |
| 2013/0248999 A1* | 9/2013 | Glass et al. | 257/335 |
| 2013/0267084 A1* | 10/2013 | Jensen et al. | 438/530 |
| 2013/0277769 A1* | 10/2013 | Tung et al. | 257/412 |
| 2014/0008727 A1* | 1/2014 | Loo et al. | 257/347 |

* cited by examiner

PULSED LASER ANNEAL PROCESS FOR TRANSISTORS WITH PARTIAL MELT OF A RAISED SOURCE-DRAIN

CROSS-REFERENCE TO RELATED APPLICATION

This application is a U.S. National Phase application under 35 U.S.C. §371 of International Application No. PCT/US2011/065910, filed Dec. 19, 2011, entitled PULSED LASER ANNEAL PROCESS FOR TRANSISTORS WITH PARTIAL MELT OF A RAISED SOURCE-DRAIN.

TECHNICAL FIELD

Embodiments of the present invention relate to transistors and more particularly relate to laser annealing of a raised source and/or a raised drain of a transistor.

BACKGROUND

While laser "melt" anneal processes for transistor source and/or drain (i.e., source/drain) formation are known, they are not typical in high volume logic device manufacturing. One forecasted application for a pulsed laser anneal process is to melt semiconductor material in the source/drain. The melt advantageously increases the activation of dopants relative to other forms of anneal where the semiconductor is not melted, thereby improving transistor parametrics, such as external resistance ($R_{ext}$), specific contact resistance ($R_c$), etc. The melt is possible in a planar architectures in part because for a crystalline semiconductor substrate, or perhaps an insulating field dielectric surrounds the sides of the source/drain, forming a "bowl" capable of containing the melt.

For non-planar architectures, for example where a semiconductor fin structure is formed, the source/drain is typically elevated from the surroundings such that a laser melt anneal can cause a raised source/drain to flow, losing its desired shape, structural relationship to, and/or electrical continuity with, the channel region of the transistor.

Non-planar architectures benefiting from the higher source/drain dopant activation possible through laser anneal and techniques for performing such laser anneals are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1A:
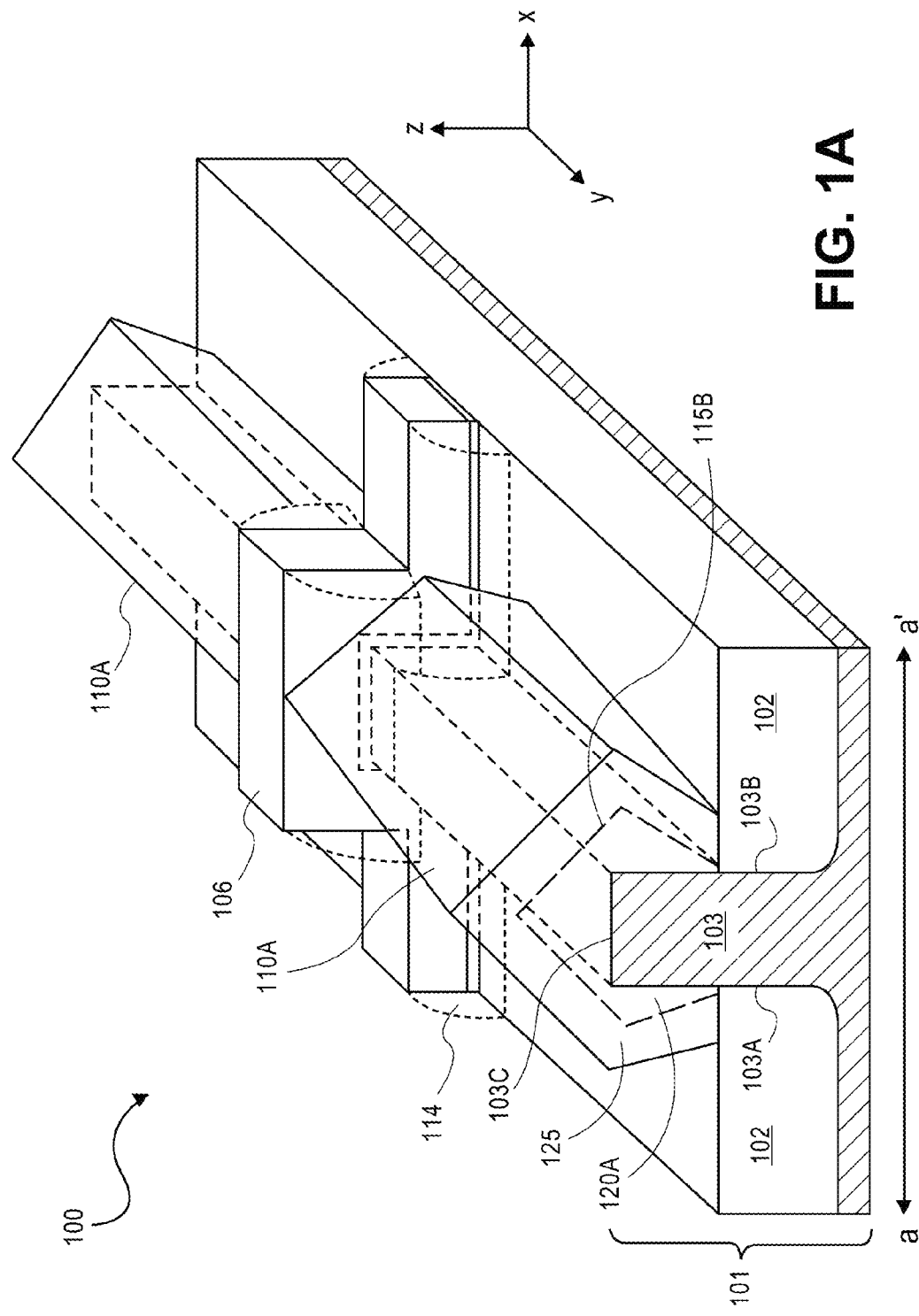
FIG. 1A is a cross-sectional isometric illustration of a non-planar transistor with a raised source and drain, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are non-planar transistor embodiments including partially melted raised semiconductor source/drains disposed on opposite ends of a semiconductor fin with the gate stack disposed there between. The raised semiconductor source/drains comprise a super-activated dopant region above a melt depth and an activated dopant region below the melt depth. The super-activated dopant region has a higher activated dopant concentration than that of the activated dopant region and/or has an activated dopant concentration that is constant throughout the melt region. Methods of fabrication include forming a fin on a substrate and depositing a semiconductor material or a semiconductor material stack on regions of the fin disposed on opposite sides of a channel region to form raised source/drains. A pulsed laser anneal is performed to melt only a portion of the deposited semiconductor material above a melt depth. The super-activated region, as contained to a melt depth that corresponds to less than an entirety of the raised source/drain limits the loss of raised source/drain semiconductor material integrity. Even with less than all of the raised source/drain region melted by the laser anneal, it has been found that in embodiments, the super-activated region formed above the melt depth improves transistor parametrics, for example $R_c$, relative to a raised source/drain having only conventional dopant activation.

Embodiments of the present invention may be applied to planar or non-planar MOS-FETs (i.e., finFETs) which have a raised source/drain. For example, devices with a three-dimensional architecture, such as tri-gate or multi-gate devices may utilize the attributes and techniques described herein. FIG. 1A is a cross-sectional isometric illustration of a non-planar (tri-gate) transistor 100 with a raised source and drain, in accordance with an embodiment. The transistor 100 is disposed on a bulk-substrate 101, which may be any conventional material, such as, but not limited to single crystalline silicon, germanium, III-V compound semiconductor (e.g., GaAs, InP, etc.), III-Nitride compound semiconductor (e.g., GaN), or sapphire. In alternate embodiments, semiconductor on insulator (SOI) substrates are utilized, as known in the art.

The non-planar transistor 100 includes a semiconductor fin 103 (e.g. consisting essentially of monocrystalline silicon), having opposing sidewalls 103A, 103B and a top surface 103C. Adjacent to a portion of the fin sidewalls 103A, 103B is a field isolation dielectric 102 (e.g., silicon dioxide). A gate electrode stack 106 is formed around at least the sidewalls 103A, 103B of the fin 103 to form a semiconducting channel region 204 (depicted in FIG. 1B).

Figure 1B:
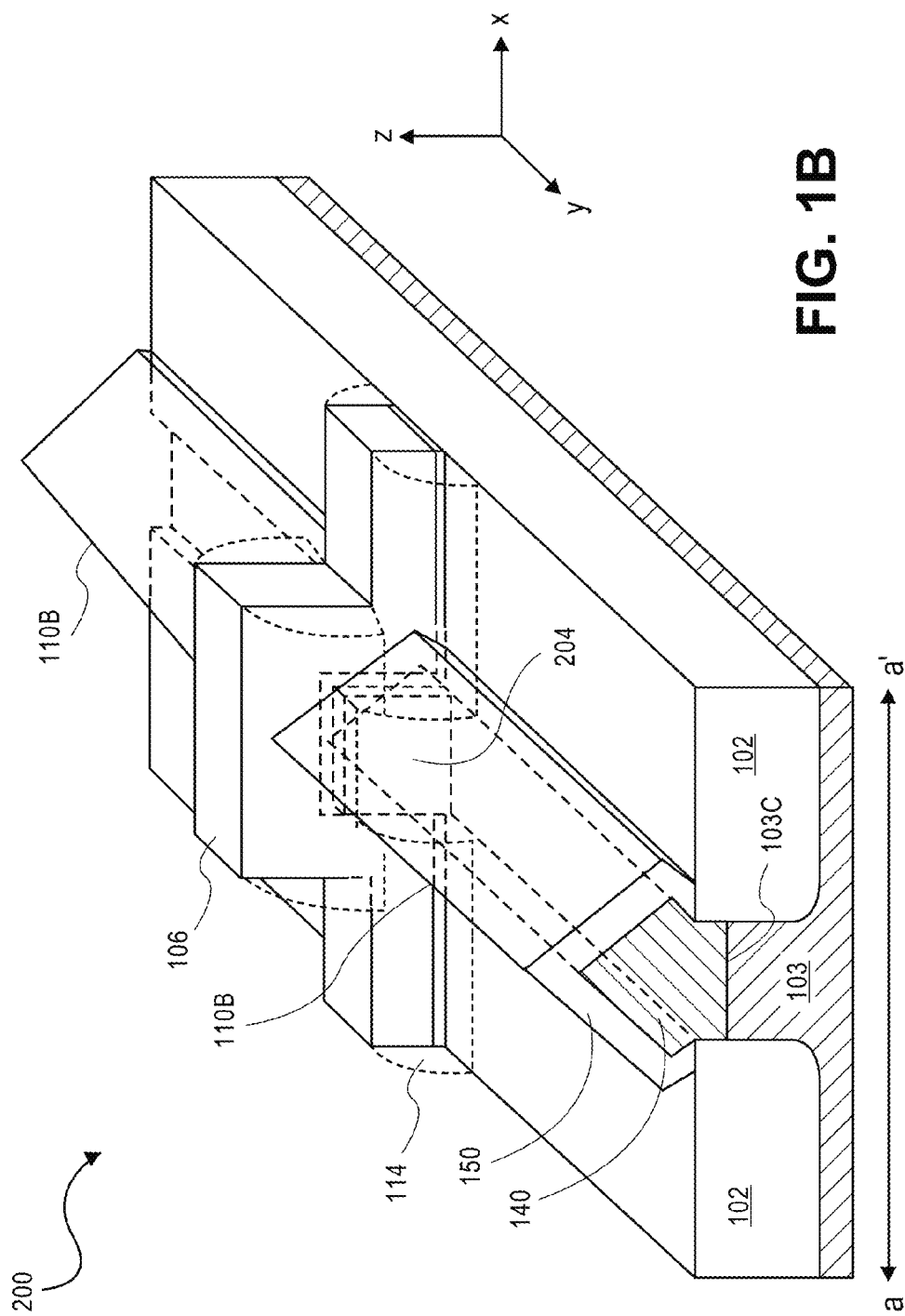
FIG. 1B is a cross-sectional isometric illustration of a non-planar transistor with a raised source and drain, in accordance with an embodiment.

A source/drain 110A is disposed at opposite ends of the fin 103, on either side of the gate electrode stack 106 as separated by an intervening pair of gate isolation spacers 114. The source/drain 110A is "raised" from the fin 103 by at least one semiconductor material that is deposited on one or more surfaces of the fin 103. In FIG. 1A, the raised source/drain includes a dopant activated semiconductor material 120A deposited on each of the opposite fin sidewalls 103A, 103B as well as the top fin surface 103C. FIG. 1B is an isometric illustration of a non-planar transistor 200 with a raised source/drain 110B, in accordance with another embodiment where the raised source/drain includes an activated first semiconductor material 140 deposited on only the top fin surface 103C because the semiconductor fin 103 is recessed below the field isolation dielectric 102.

Returning to FIG. 1A, in embodiments, raised source/drain 110A consists essentially of a homogenous semiconductor material. In one such embodiment, the raised source/drain 110A consists essentially of silicon (e.g., same as the fin 103) or consists essentially of a silicon-germanium (SiGe) alloy, or any other known compound semiconductor. The raised source/drain 110A includes electrically activated dopants (e.g., n-type for an NMOS device and p-type for a PMOS device). The portions of the fin 103 disposed below the raised source/drain 110A also includes electrically activated dopants in the exemplary embodiment.

For embodiments illustrated by FIG. 1A, although the raised source/drain 110A is of a homogenous semiconductor material, activated dopant concentration is distinguished between the activated semiconductor material 120A disposed below a melt depth 115B and a super-activated semiconductor material 125 disposed above the melt depth 115B. The melt depth 115B therefore represents the interface within the raised source/drain 110A between deposited semiconductor material that has been laser annealed and therefore super-active and deposited semiconductor material that has not been laser anneal and therefore active, but not super-active. The melt depth 115B may vary so that the relative proportion of the raised source/drain comprising the super-activated semiconductor material 125 may vary. However, in the exemplary embodiment the melt depth 115B does not coincide with any point on a surface of the fin 103. As such, with the melt depth 115B not contact the fin 103, the super-activated semiconductor material 125 is contained entirely within deposited semiconductor material that is the raised source/drain 110A.

Figure 3:
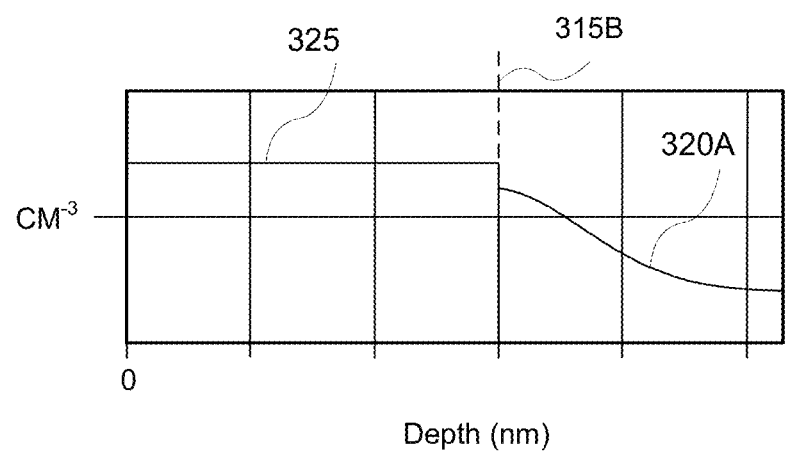
FIG. 3 is a dopant profile of a raised source/drain, in accordance with an embodiment.

FIG. 3 is a line plot representing an activated dopant profile (e.g., $cm^{-3}$) of a raised source/drain as a function of depth into a raised source/drain, in accordance with an embodiment. Generally, FIG. 3 is representative of a depth profile taken at any incident milling angle into the raised source/drain 110A, although absolute depths and dopant concentrations can be expected to vary based on the technique employed for doping the raised source/drain 110A and on the milling path, etc. As shown, above the demarcation 315B, corresponding with the melt depth 115B, there is an abrupt, box-like dopant profile 325 that is substantially constant throughout the thickness of the super-activated semiconductor material 125. The activated dopant concentration is not a function of depth within the super-activated semiconductor material 125 because of the equilibrium achieved through a laser melt anneal. At the demarcation 315B, there is a discontinuity in the dopant profile where the box-like dopant profile 325 meets a conventional solid state diffusion limited dopant profile 320A within the activated semiconductor material 120A. As illustrated, within the activated semiconductor material 120A, the dopant profile is a function of the depth within the raised source/drain. In the exemplary embodiment, the concentration of activated dopants is also higher within the super-activated semiconductor material 125 than it is within the activate semiconductor material 120A.

In embodiments, a raised source/drain includes a deposited semiconductor stack of two or more distinct semiconductor materials. In embodiments, the distinct semiconductor materials are utilized, at least in part, to differentiate the melting temperature within the raised source/drain. Generally, a lowest melting temperature semiconductor is to be a top layer of the deposited semiconductor stack and a highest melting temperature semiconductor is to be a bottom layer of the deposited semiconductor stack to ensure a melt of the lowest melting temperature semiconductor is contained within the raised source/drain 110A by the highest melting temperature semiconductor.

FIG. 1B illustrates an exemplary embodiment where the raised source/drain 110B includes the activated first semiconductor material 140 and the super-activated second semiconductor material 150B where the first and second semiconductor materials are distinct such that the second semiconductor material has a lower melting temperature than the first semiconductor material. Generally, the semiconductor materials selected for the first and second semiconductor materials may be any that have sufficient difference in melting temperature to accommodate the goal of limiting the melt depth to somewhere above the fin surface (e.g., 103C in FIG. 1B). In one exemplary embodiment, the activated first semiconductor material 140 consists essentially of silicon while the super-activated second semiconductor material 150B consists essentially of GaAs. In another exemplary embodiment, the activated first semiconductor material 140 consists essentially of InP while the super-activated second semiconductor material 150B consists essentially of GaP. In another exemplary embodiment, the activated first semiconductor material 140 consists essentially of silicon while the super-activated second semiconductor material 150B consists essentially of a SiGe alloy.

Figure 2A:
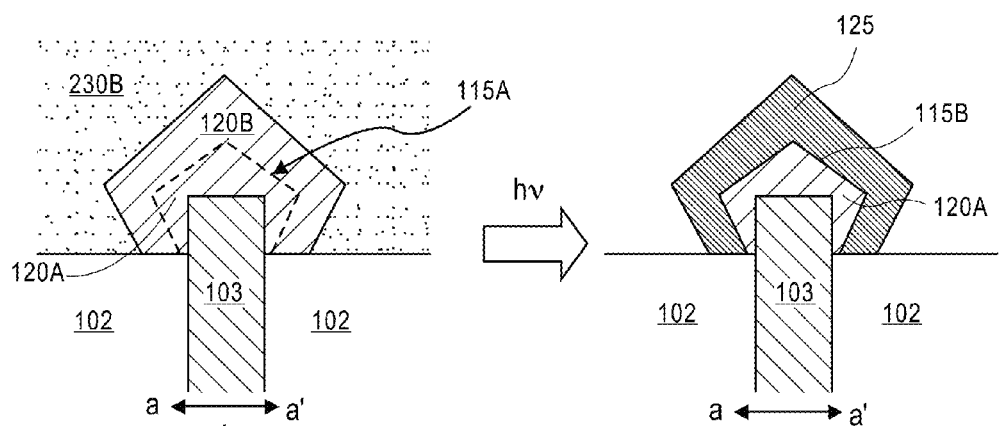
FIGS. 2A, 2B and 2C are cross-sectional illustrations of a raised source/drain in accordance with embodiments.
Figure 2B:
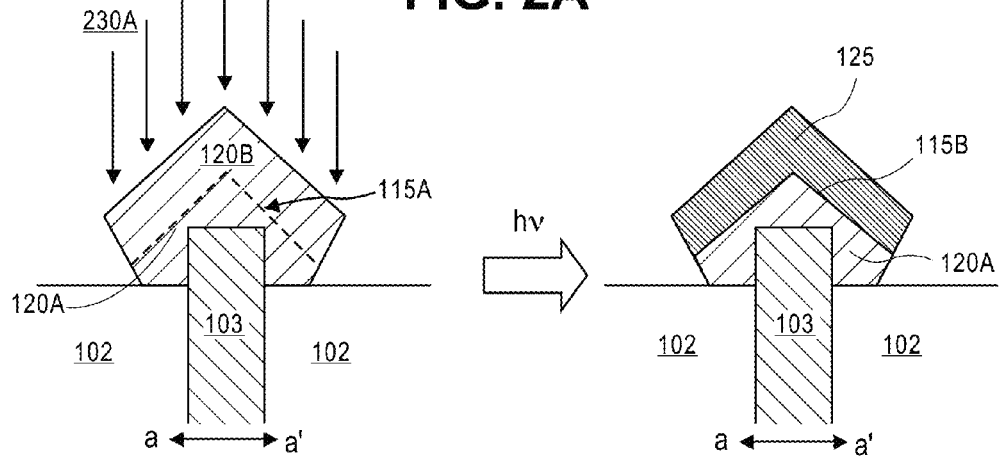
Figure 2C:
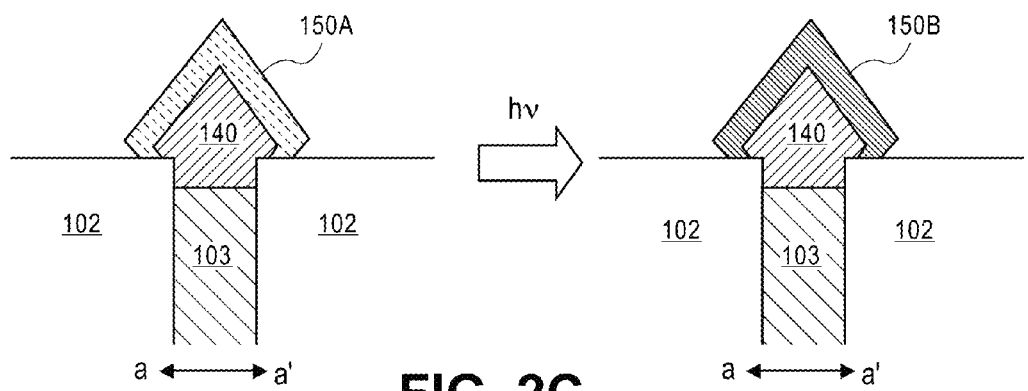

The melt depth 115B has a morphology dependent on the method employed to control the laser melt anneal to some portion of a raised source/drain. FIGS. 2A, 2B and 2C are cross-sectional illustrations of a raised source/drain in accordance with embodiments. In the exemplary illustrations, the cross-section is through a source/drain along the a-a' plane substantially as illustrated in FIGS. 1A and 1B. In the embodiments corresponding to FIGS. 2A and 2B, a pre-amorphization implant sets the melt depth 115B within a homogenous deposited semiconductor material.

In FIG. 2A, where a conformal plasma 230B is utilized for the pre-amorphization implant, amorphizing species (e.g., silicon, germanium, xenon, etc.) are conformally implanted to an amorphization depth 115A that is substantially conformal to an outer surface of the raised source drain region. As shown in FIG. 2A, the amorphized region 120B forms a shell of substantially constant thickness (i.e., within 10%). In the exemplary embodiment, the pre-amorphization implant conditions are such that the amorphization depth 115A does not contact the semiconductor fin 103 (i.e., not all of activated semiconductor material 120A is amorphized). Notably, the conformality of the plasma implant enables the amorphized region 120B to contact the field isolation dielectric 102 which may advantageous reduce contact resistance where a contact metal will subsequently wrap around the raised source/drain and also contact the field isolation dielectric 102. As further illustrated by FIG. 2A, following the pulsed laser anneal (hv), the amorphized region 120B becomes the super-activated semiconductor material 125 with the melt depth 115B following the amorphization depth 115A.

In FIG. 2B, where a beamline pre-amorphization implant 230A is utilized, a non-conformal amorphized region 120B forms a cap of substantially constant depth or thickness where the implant is symmetric relative to the exterior surface of the raised source/drain. Alternatively where the implant conditions are asymmetric (e.g., with a high angle of incidence), the amorphized region 120B may be of varying depth or thickness. Notably, the non conformality of the beamline implant confines the amorphized region 120B off the field isolation dielectric 102. As further shown in FIG. 2B, following the pulsed laser anneal (hv), the amorphized region 120B again becomes the super-activated semiconductor material 125 with the melt depth 115B following the amorphization depth 115A.

In the embodiments corresponding to FIG. 2C, a differential composition in the as-deposited semiconductor layers sets the melt depth 115B. For such embodiments, epitaxial growth processes are utilized to set the melt depth 115B with growth conditions defining the morphology of the interface between the first semiconductor material 140 and the second semiconductor material 150A, which upon melting becomes the super-activated semiconductor second semiconductor material 150B. Furthermore, in embodiments etching of the first semiconductor material 140 prior to deposition of the second semiconductor material 150A may provide further control over the subsequent melt.

Figure 4:
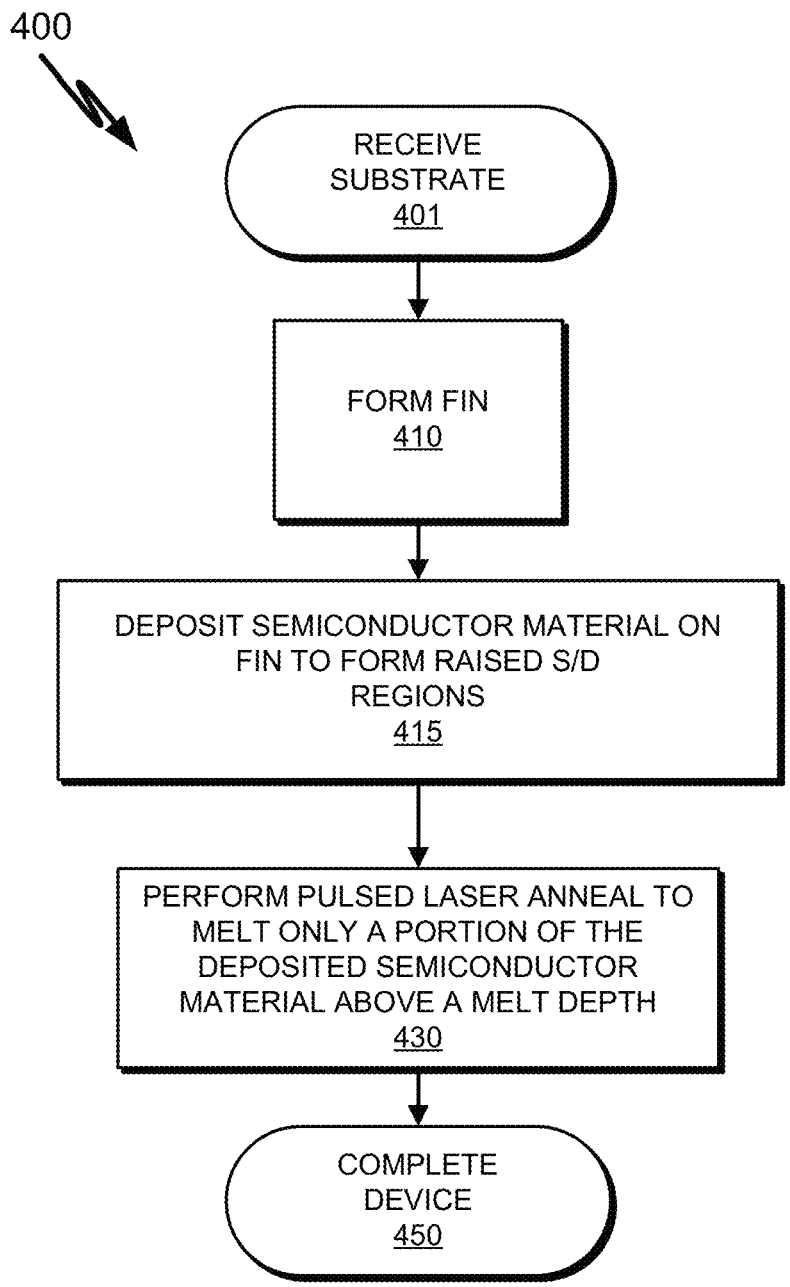
FIG. 4 is a flow diagram illustrating a method of fabricating a non-planar transistor with a raised source and drain, in accordance with an embodiment.

FIG. 4 is a flow diagram illustrating a method 400 of fabricating a non-planar transistor with a raised source and drain, in accordance with an embodiment. Method 400 begins with receiving a substrate, such as a silicon or SOI wafer as described elsewhere herein. At operation 410 a fin is formed on the substrate. Any conventional technique known in the art may be employed at operation 410 to form the fin. For example, two shallow trench isolation (STI) regions may be formed and then the STI regions recessed to exposed a fin disposed there between. In another exemplary embodiment, a portion of a silicon layer in an SOI wafer is masked to form the fin. Also at operation 410, a gate stack (sacrificial or permanent) may be formed over a channel region of the fin (e.g., gate stack 106 in FIGS. 1A, 1B).

At operation 415, semiconductor material is deposited on the fin to form raised source/drain regions on opposite sides of a channel region in the fin. Any known technique for depositing semiconductor material suitable for the purpose of forming a raised source/drain may be utilized at operation 415. In one exemplary embodiment, a selective chemical vapor deposition (CVD) or molecular beam epitaxy (MBE) process is utilized to deposit polycrystalline semiconductor material over the exposed fin surfaces. In another exemplary embodiment, the CVD or MBE process forms a crystalline semiconductor material over the exposed fin surfaces with the semiconductor material having the same crystallinity (e.g., monocrystalline and having same crystallographic orientation) as the fin.

At operation 430, a laser anneal is performed to melt only a portion of the deposited semiconductor material of the raised source/drain that is above a melt depth. Any known laser anneal process known to be suitable for source/drain activation may be employed. In one embodiment, a pulsed laser of a conventional wavelength, fluence, and pulse frequency is employed. Following operation 430, the transistor is completed at operation 450 through standard practices of the art.

Figure 5:
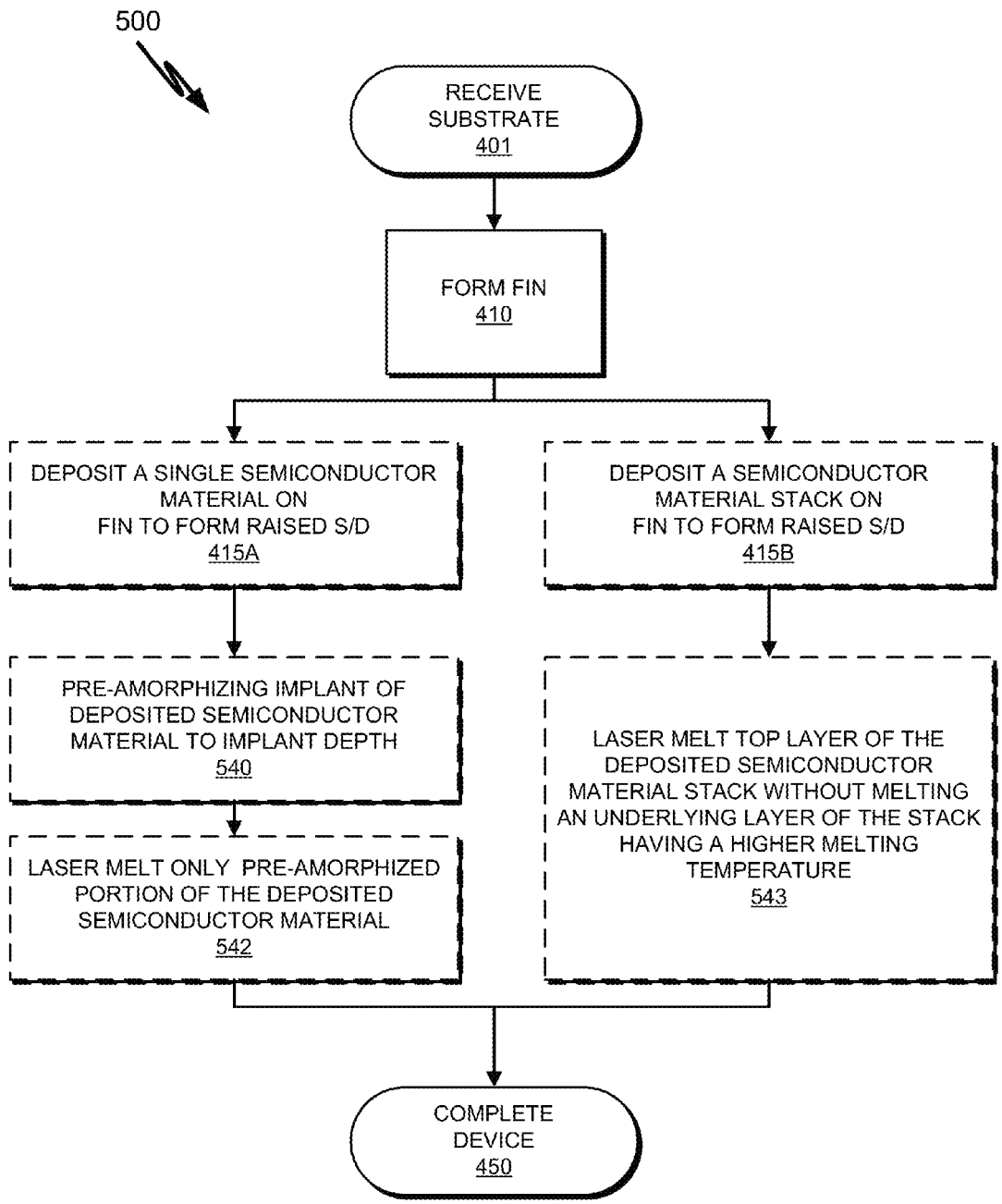
FIG. 5 is a flow diagram illustrating methods of laser annealing only a portion of a raised source/drain, in accordance with embodiments.

FIG. 5 is a flow diagram illustrating a method 500 of laser annealing only a portion of a raised source/drain, in accordance with embodiments. The method 500 begins with the operations 401 and 410, as described elsewhere herein. Following operation 410, in one embodiment the method 500 proceeds to operation 415A where a single semiconductor material is deposited on the fin to form a raised S/D region (or at least where multiple semiconductor materials are deposited, the difference in composition does not provide a significant difference in melting temperature). For this embodiment, at operation 540 a preamorphizing implant is performed to amorphize a portion of the deposited semiconductor material to an implant depth (e.g., as illustrated in FIGS. 2A, 2B). Depending on the embodiment, the pre-amorphizing implant may be any of a beamline ion implantation, an angled implantation, or a conformal plasma implantation. Following the pre-amorphizing implant, the laser melt operation 542 is performed substantially as described elsewhere herein, melting only the pre-amorphized portion of the semiconductor material deposited at operation 415A.

In another embodiment, method 500 proceeds from operation 410 to operation 415B where a semiconductor material stack is deposited on the fin to form a raised source/drain. In one embodiment of operation 415B, a first semiconductor material is deposited on the fin and then a second semiconductor material of differing composition is deposited over the first semiconductor material. The melting temperature of the first semiconductor material is higher than that of the second semiconductor material (e.g., at least 100° C., and preferably 200° C. or more). Subsequent to operation 415B, a laser anneal is performed at operation 543 to melt the top deposited semiconductor material without melting the underlying first semiconductor material. The method 500 then completes at operation 450, as previously described.

FIGS. 6A, 6B, 6C, 6D, 6E, 6F are flow diagrams illustrating methods of laser annealing only a portion of a semiconductor layer in a raised source/drain, in accordance with embodiments wherein the raised source/drain includes a single semiconductor material of substantially homogenous melting temperature.

Figure 6A:
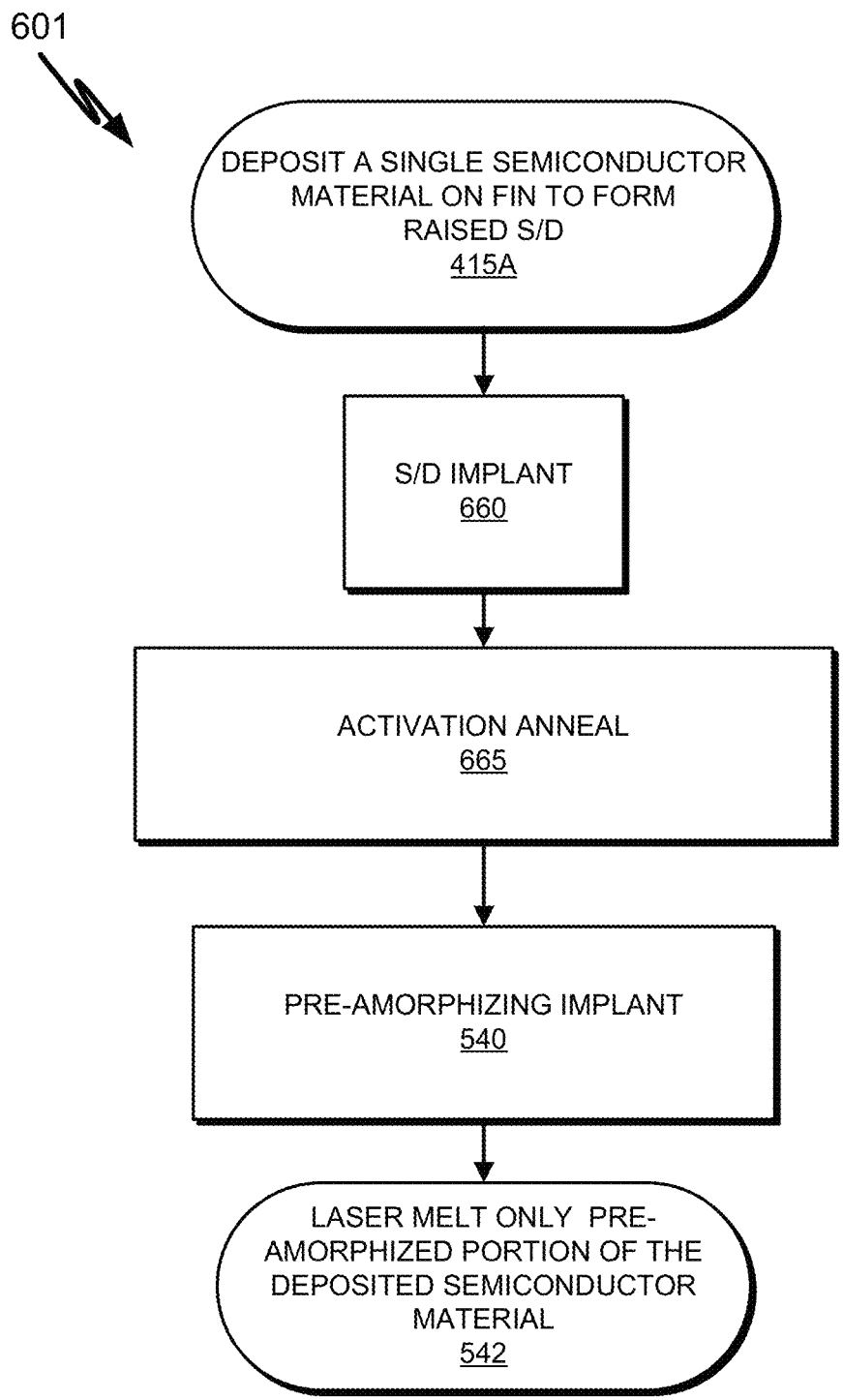
FIGS. 6A, 6B, 6C, 6D, 6E, 6F are flow diagrams illustrating methods of laser annealing only a portion of a semiconductor layer in a raised source/drain, in accordance with embodiments.

FIG. 6A illustrates a first embodiment where method 601 begins at operation 415A with depositing a single semiconductor material (e.g., silicon, germanium, SiGe, GaAs, GaP, etc.) on a fin to form a raised source/drain. At operation 660, a source/drain implant is performed using any conventional source/drain implant technique in the art. For example, in an NMOS transistor, an N-type dopant, such as phosphorus or arsenic may be implanted at operation 660. Or, in a PMOS transistor, an P-type dopant, such as boron may be implanted at operation 660. At operation 665, an activation anneal is performed to electrically activate dopants within the raised source/drain region (e.g., those implanted at operation 660). In embodiments, the activation anneal is at least one of a furnace thermal anneal, a rapid thermal anneal, a microwave anneal, a flash anneal, or a sub-melt laser anneal where conventional temperatures and anneal times are such that the raised source/drain is not melted. The pre-amorphizing implant is then performed at operation 540, substantially as described elsewhere herein. A pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer.

Figure 6B:
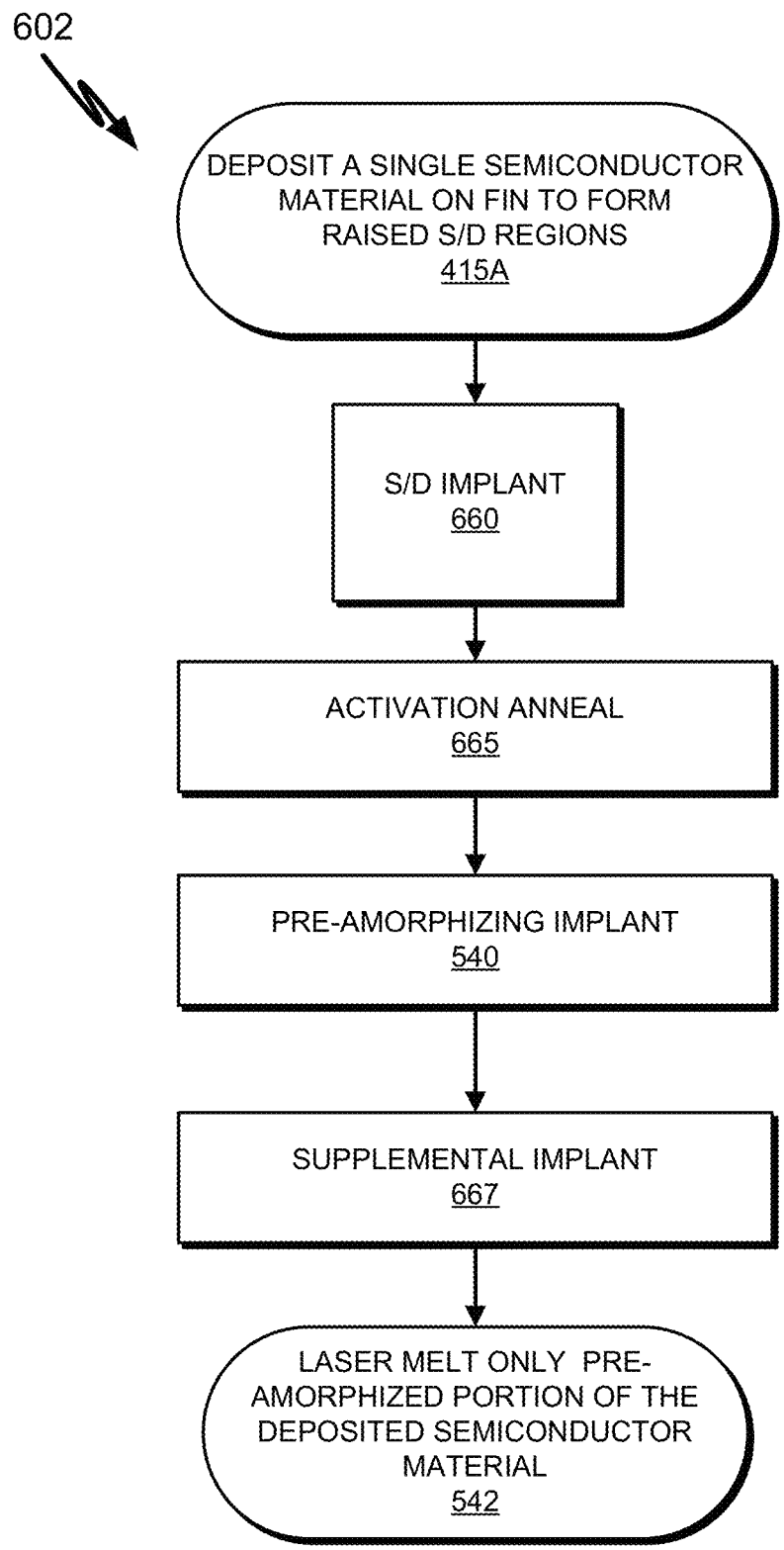

FIG. 6B illustrates a second embodiment where method 602 begins at operation 415A with depositing a single semiconductor material (e.g., silicon, germanium, SiGe, GaAs, GaP, etc.) on a fin to form a raised source/drain. At operation 660, a source/drain implant is performed using any conventional source/drain implant technique of the art. For example, in an NMOS transistor, an N-type dopant, such as phosphorus or arsenic may be implanted at operation 660. Or, in a PMOS transistor, an P-type dopant, such as boron may be implanted at operation 660. At operation 665, an activation anneal is performed to electrically activate dopants within the raised source/drain region (e.g., those implanted at operation 660). The pre-amorphizing implant is then performed at operation 540, substantially as described elsewhere herein. Subsequently, a supplemental implant is performed at operation 667. The supplemental implant or co-implant may be of a same or different species as that implanted during the source/drain implant operation 660. The supplemental implant may serve to increase dopant concentrations within a portion of the activated raised source/drain. Following the supplemental implant operation 667, a pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer.

Figure 6C:
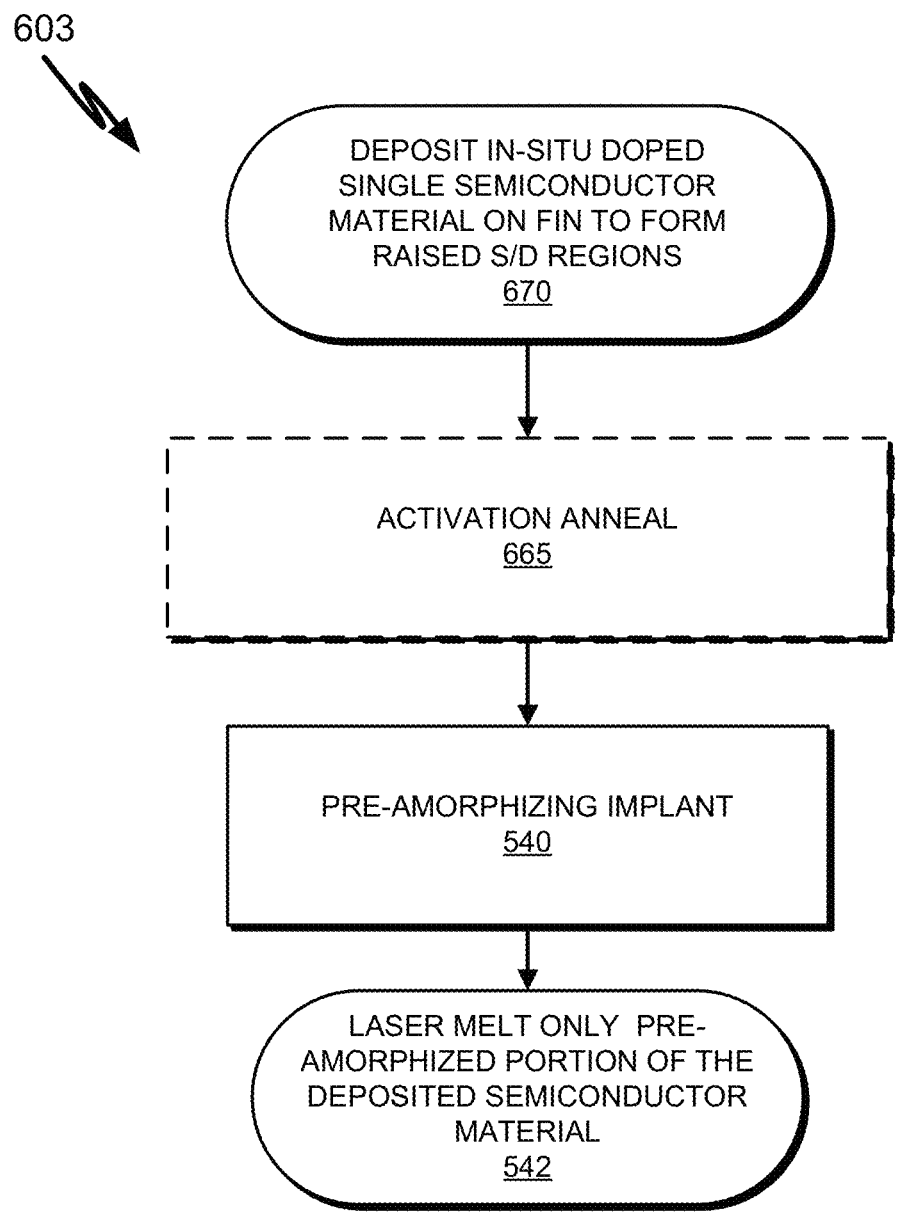

FIG. 6C illustrates a third embodiment where method 603 begins at operation 670 with depositing a single semiconductor material (e.g., silicon, germanium, SiGe, GaAs, GaP, etc.) that is in-situ doped on a fin to form a raised source/drain. Any CVD feed gas known in the art to be useful as a source for dopants during CVD of the semiconductor may be utilized at operation 670. In the exemplary embodiment, the method 603 proceeds to the activation anneal operation 665. The activation anneal is performed to electrically activate the in-situ deposited dopants within the raised source/drain region. However, depending on the deposition process, the in-situ deposited dopants may already be electrically activated in which case the activation anneal operation 665 is not employed. Being optional, the activation anneal operation 665 is illustrated in FIG. 6C by a dashed box. The pre-amorphizing implant is then performed at operation 540, substantially as described elsewhere herein. A pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer.

Figure 6D:
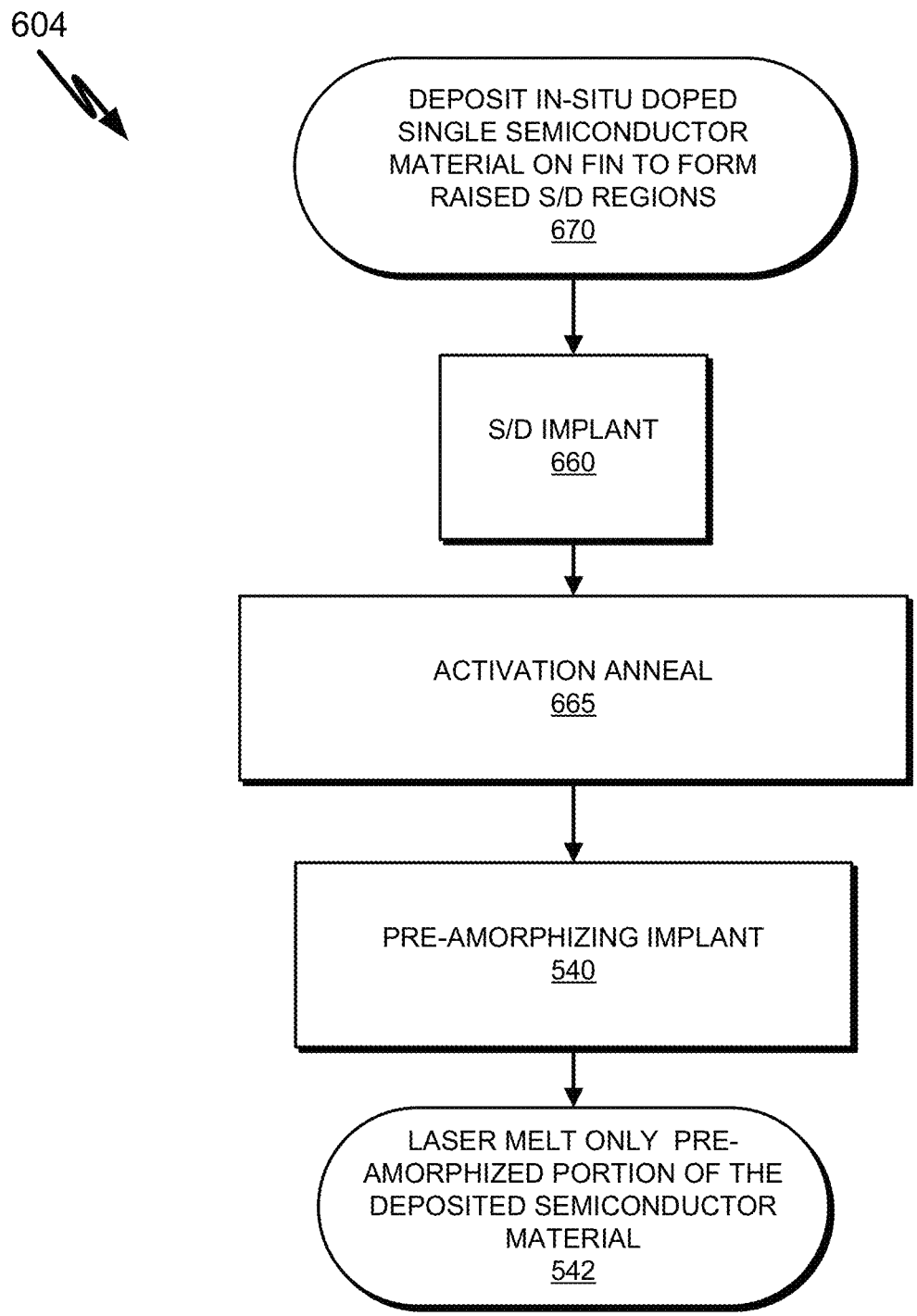

FIG. 6D illustrates a fourth embodiment where method 604 begins at operation 670 with depositing a single semiconductor material (e.g., silicon, germanium, SiGe, GaAs, GaP, etc.) that is in-situ doped on a fin to form a raised source/drain. Even though in-situ doped, the method 604 proceeds to operation 660 where a source/drain implant is performed, as describe elsewhere herein. The source/drain implant operation 660 supplements the source/drain dopants to enhance dopant concentration beyond that possible in-situ. The method 604 then proceeds to the activation anneal operation 665, which is necessary in the exemplary embodiment to activate the source/drain dopants implanted at operation 660. Following activation anneal, the pre-amorphizing implant is then performed at operation 540, substantially as described elsewhere herein. A pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer.

Figure 6E:
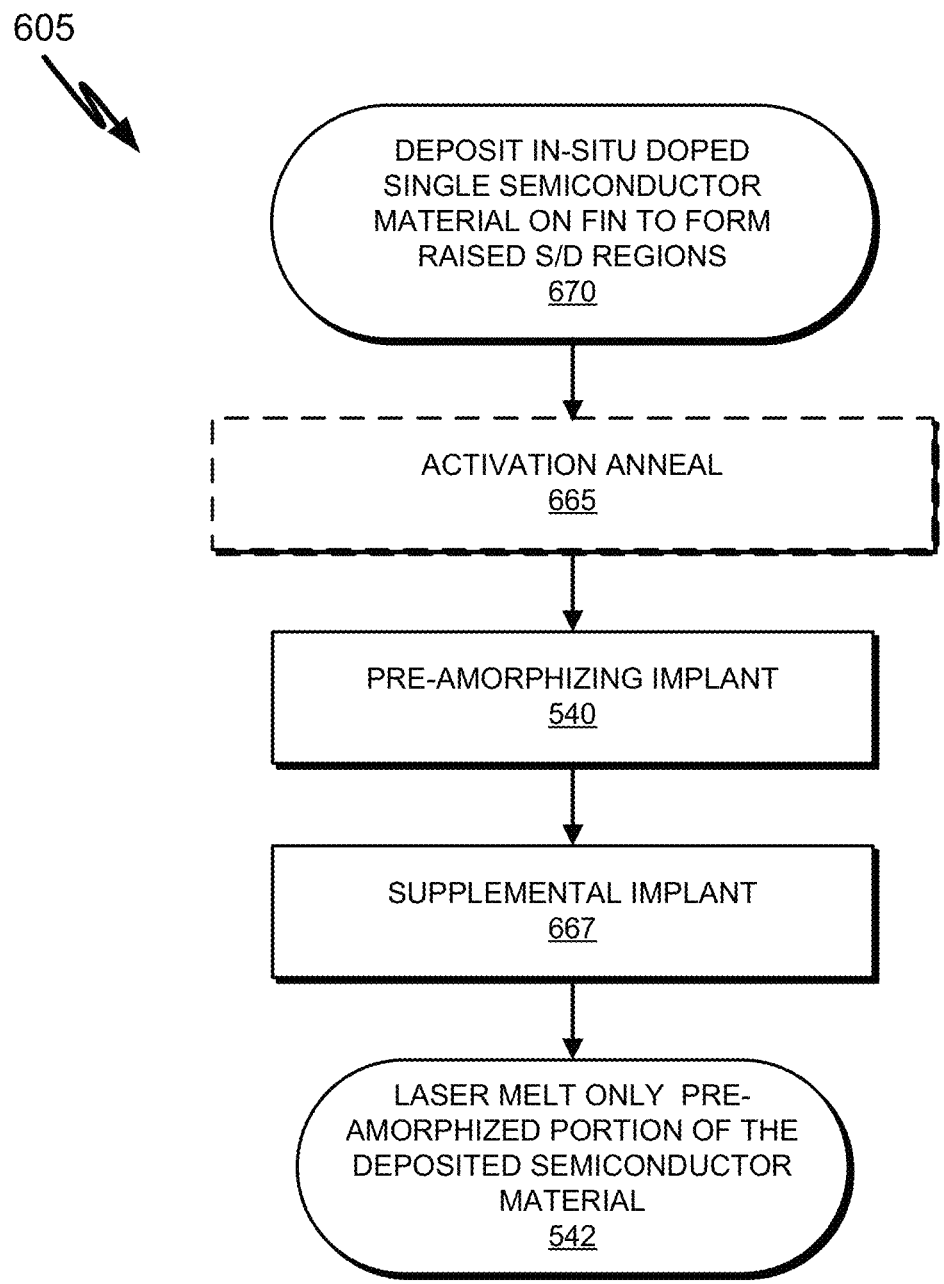

FIG. 6E illustrates a fifth embodiment where method 605 beings at operation 670 with depositing a single semiconductor material (e.g., silicon, germanium, SiGe, GaAs, GaP, etc.) that is in-situ doped on a fin to form a raised source/drain. In the exemplary embodiment, the method 605 proceeds to the optional activation anneal operation 665. Following activation anneal, the pre-amorphizing implant is then performed at operation 540, substantially as described elsewhere herein and then the supplemental implant operation 667 is performed. The supplemental implant may serve to increase dopant concentrations within a portion of the activated raised source/drain. Following the supplemental implant operation 667, a pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer and the supplemental doping is confined to the melted region.

Figure 6F:
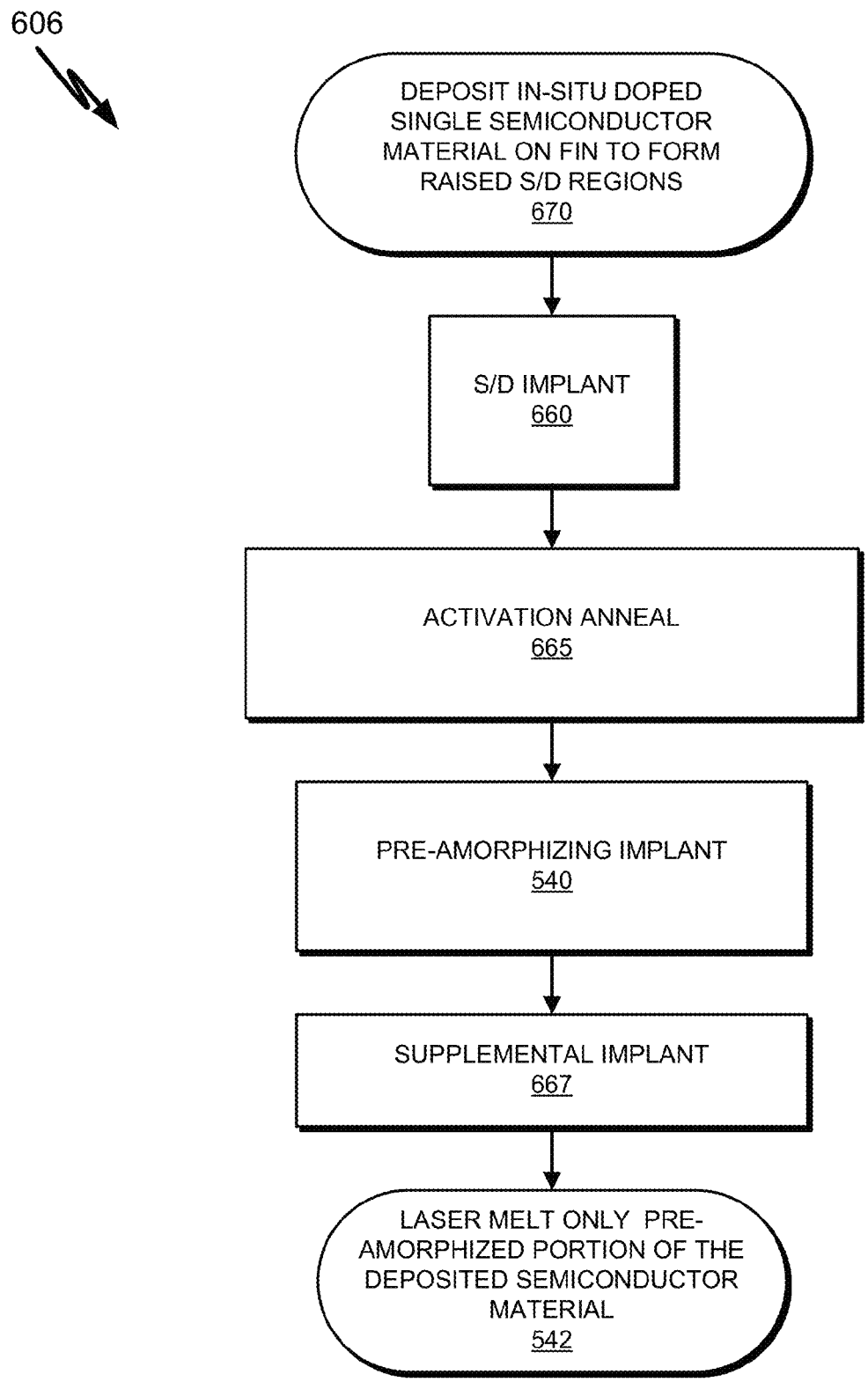

FIG. 6F illustrates a sixth embodiment where method 606 begins at operation 670 with depositing a single semiconductor material (e.g., silicon, germanium, SiGe, GaAs, GaP, etc.) that is in-situ doped on a fin to form a raised source/drain. Even though in-situ doped, the method 606 proceeds to operation 660 where a source/drain implant is performed, as describe elsewhere herein. The source/drain implant operation 660 supplements the source/drain dopants to enhance dopant concentration beyond that possible in-situ. The method 606 then proceeds to the activation anneal operation 665, which is in the exemplary embodiment to activate the source/drain dopants implanted at operation 660. Following activation anneal, the pre-amorphizing implant is then performed at operation 540, substantially as described elsewhere herein. At operation 667, a supplemental implant is performed to further enhance dopant concentration and/or implant a second species distinct from at least one of the in-situ deposited species and the species implanted at operation 660. A pulsed laser anneal melting only the pre-amorphized portion of the deposited semiconductor material is then performed at operation 542, as described elsewhere herein. Following operation 542, the raised source/drain includes a super-activated semiconductor material disposed over an activated semiconductor layer, again with the supplemental doping confined to the melted region. As such, method 606 may be considered a combination of method 604 and method 605.

Figure 7A:
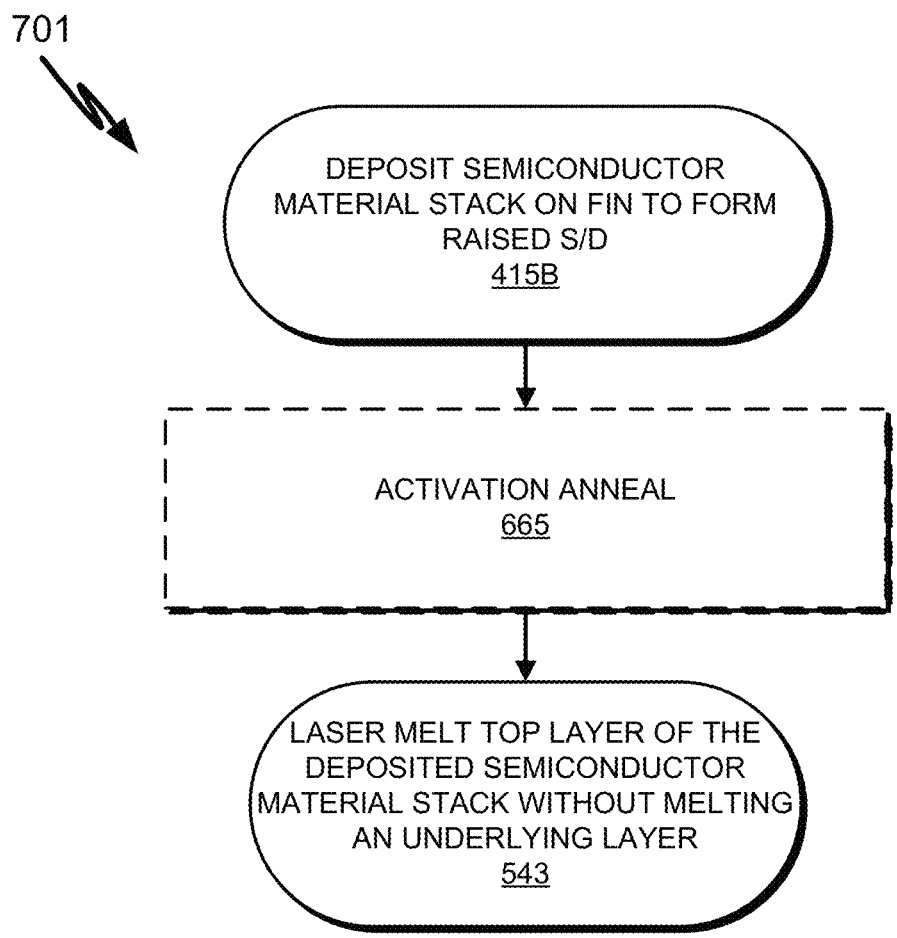
FIGS. 7A, 7B, and 7C are flow diagrams illustrating methods of laser annealing fewer than all semiconductor layers of a semiconductor stack in a raised source/drain, in accordance with embodiments.
Figure 7B:
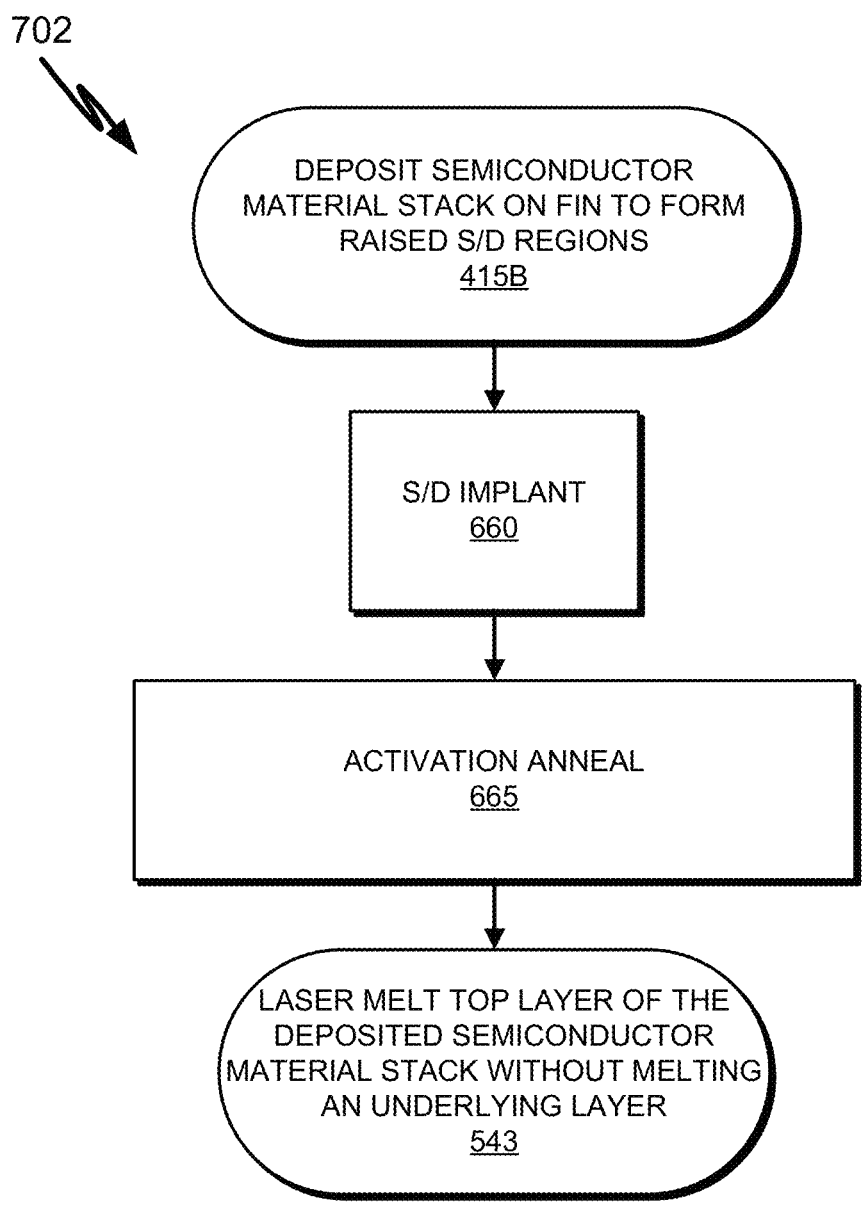
Figure 7C:
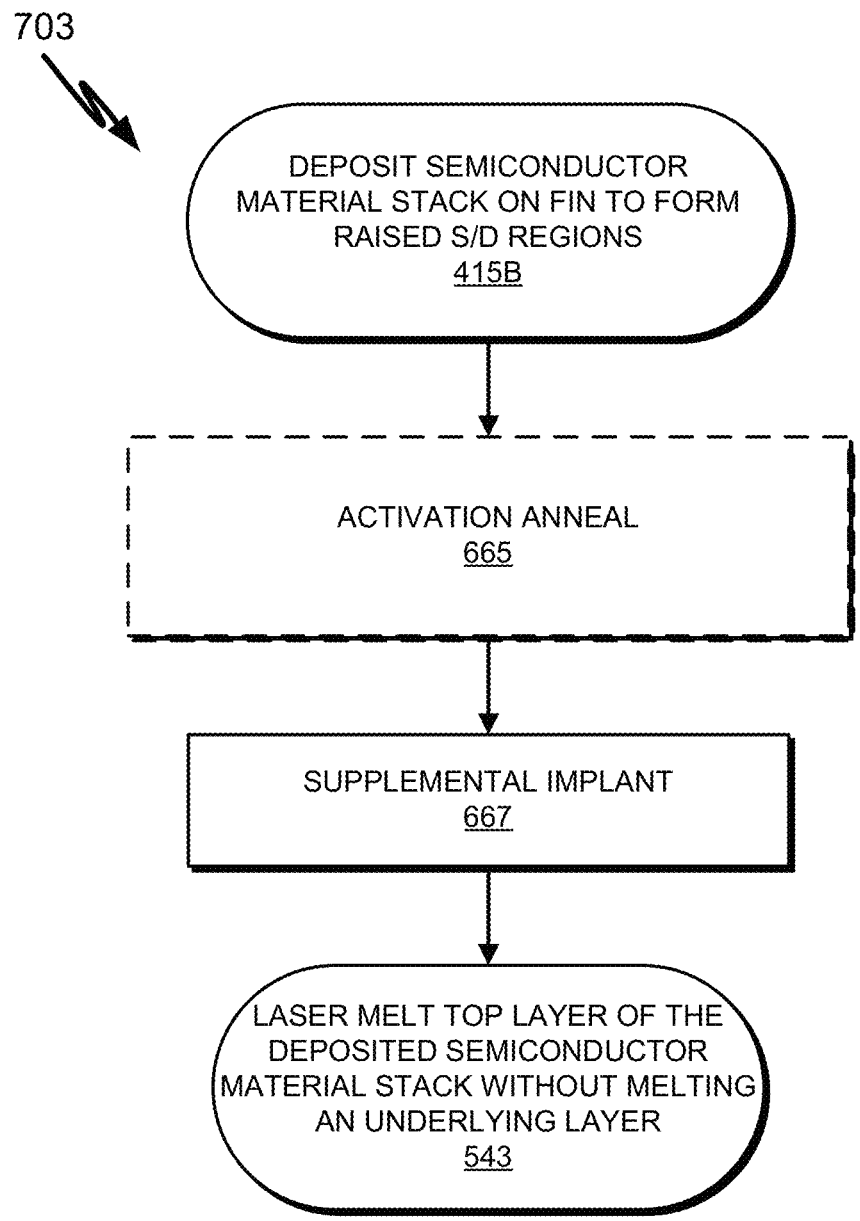

FIGS. 7A, 7B, and 7C are flow diagrams illustrating methods of laser annealing fewer than all semiconductor layers of a semiconductor stack in a raised source/drain, in accordance with embodiments.

In FIG. 7A, the method 701 begins with depositing a semiconductor material stack on a fin to form the raised source/drain at operation 415B, as described elsewhere herein. In one exemplary embodiment, a silicon layer is first deposited followed by a GaAs layer. In another exemplary embodiment, a silicon layer is first deposited followed by a SiGe layer. In another exemplary embodiment, an InP layer is first deposited followed by a GaP layer. In the exemplary embodiment, the method 701 proceeds to the activation anneal operation 665. The activation anneal is performed to electrically activate any in-situ deposited dopants within the raised source/drain region. However, depending on the deposition process at operation 415B, the in-situ deposited dopants may already be electrically activated in which case the activation anneal operation 665 is not employed. At operation 543, a pulsed laser anneal is performed to melt a top layer(s) of the deposited semiconductor stack without melting all layers of the stack (e.g., without melting a bottom semiconductor layer). In one exemplary embodiment, a GaAs layer is melted while an underlying silicon layer remains unmelted. In another exemplary embodiment, a SiGe layer is melted while an underlying silicon layer remains unmelted. In another exemplary embodiment, a GaP layer is melted while an underlying InP layer remains unmelted.

In FIG. 7B, the method 702 begins with depositing a semiconductor material stack on a fin to form the raised source/drain at operation 415B, as described for method 701. The method 702 proceeds to operation 660 where a source/drain implant is performed, as describe elsewhere herein. The source/drain implant operation 660 supplements the source/drain dopants to enhance dopant concentration beyond that possible during the stack deposition at operation 415B. The method 702 then proceeds to the activation anneal operation 665, which is in the exemplary embodiment to activate the source/drain dopants implanted at operation 660. At operation 543, a pulsed laser anneal is performed to melt a top layer(s) of the deposited semiconductor stack without melting all layers of the stack (e.g., without melting a bottom semiconductor layer), as described for method 701.

In FIG. 7C, the method 703 begins with depositing a semiconductor material stack on a fin to form the raised source/drain at operation 415B, as described for method 701. In the exemplary embodiment, the method 703 proceeds to the activation anneal operation 665. The activation anneal is performed to electrically activate any in-situ deposited dopants within the raised source/drain region. However, depending on the deposition process at operation 415B, the in-situ deposited dopants may already be electrically activated in which case the activation anneal 665 is not employed. At operation 667, a supplemental implant is performed to further enhance dopant concentration and/or implant a second species distinct from at least one of the in-situ deposited species. At operation 543, a pulsed laser anneal is performed to melt a top layer(s) of the deposited semiconductor stack without melting all layers of the stack (e.g., without melting a bottom semiconductor layer), as described for method 701.

Figure 8:
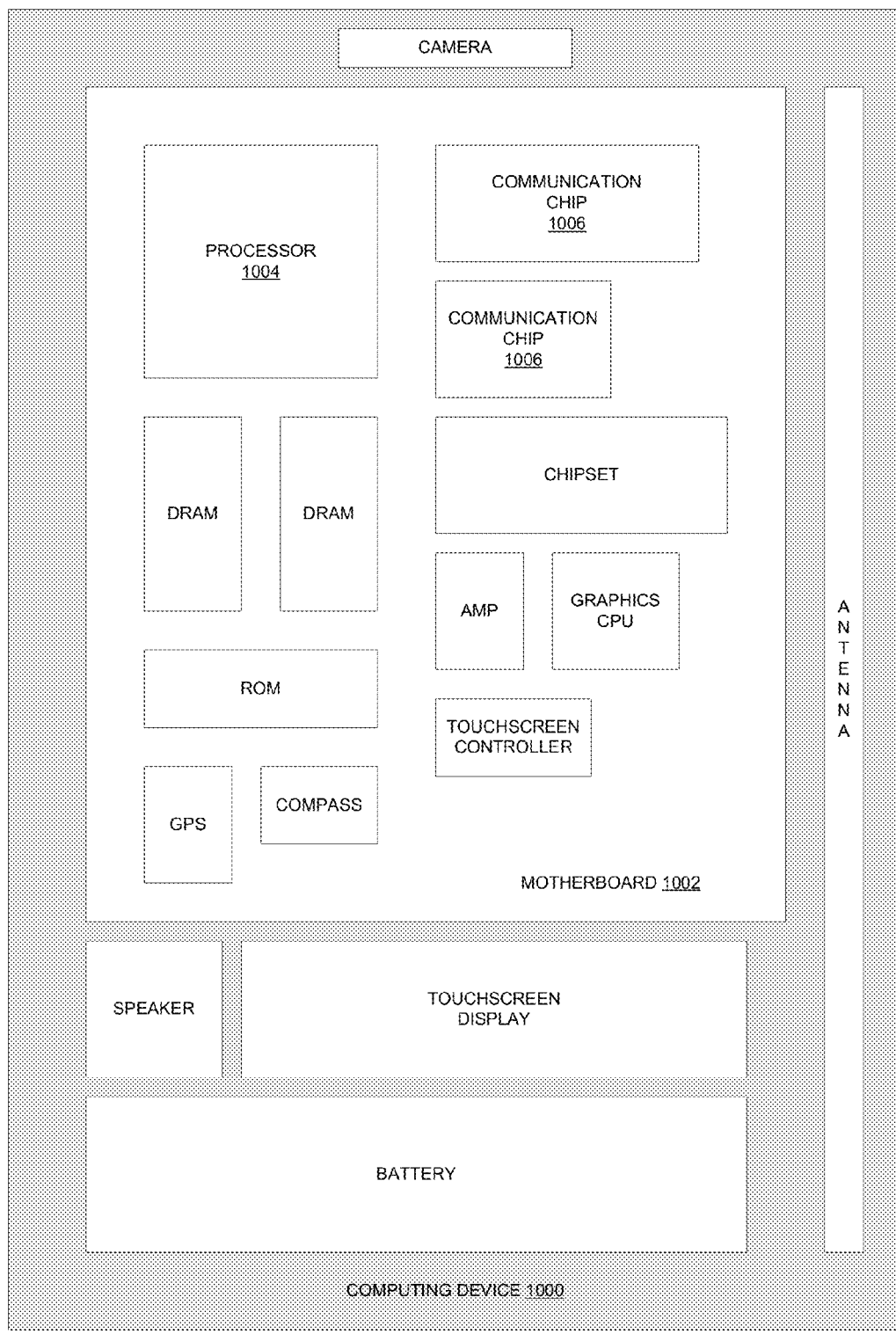
FIG. 8 is a functional block diagram of a mobile computing system in which the non-planar transistors described herein are employed, in accordance with embodiments.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as non-planar transistors that are formed with partial melts of the raised source/drain. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as non-planar transistors that are formed with partial melts of the raised source/drain.

In further implementations, another component housed within the computing device 1000 may contain an integrated circuit die that includes one or more devices, such as non-planar transistors that are formed with partial melts of the raised source/drain.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming a non-planar transistor, the method comprising:
    forming on a substrate a semiconductor fin including a channel region;
    depositing semiconductor material on regions of the fin disposed on opposite sides of the channel region to form raised source/drains; and
    performing a pulsed laser anneal to melt only a portion of the deposited semiconductor material, wherein the melted portion extends to a melt depth.

2. The method of claim 1, wherein performing the pulsed laser anneal to melt a portion of the deposited semiconductor material above a melt depth further comprises:
    performing a pre-amorphizing implant of the deposited semiconductor material to the melt depth prior to performing the pulsed laser anneal and melting only a pre-amorphized portion of the deposited semiconductor material during the pulsed laser anneal;
    or melting a top layer of the deposited semiconductor material having a first melting temperature without melting an underlying layer of the deposited semiconductor material having a second melting temperature higher than the first melting temperature.

3. The method of claim 1, further comprising: activating dopants disposed in the deposited semiconductor material below the melt depth.

4. The method of claim 3, wherein the activating further comprises at least one of: a furnace thermal anneal, a rapid thermal anneal, a microwave anneal, a flash anneal, or a sub-melt laser anneal.

5. The method of claim 3, wherein the activating is performed prior to performing the laser anneal.

6. The method of claim 3, further comprising implanting the dopants into the deposited semiconductor material.

7. The method of claim 6, wherein implanting further comprising a beamline ion implantation, an angled implantation, or a conformal plasma implantation.

8. The method of claim 1, further comprising implanting supplemental dopants into the semiconductor material above the melt depth prior to performing the pulsed laser anneal.

9. The method of claim 8, wherein the supplemental dopants are implanted after performing at least one of: a pre-amorphizing implant or an activation anneal.

10. The method of claim 1, wherein the depositing further comprises in-situ doping the semiconductor material with the dopants.

11. The method of claim 10, further comprising implanting supplemental dopants into the in-situ doped semiconductor material prior to performing the pulsed laser anneal, wherein the supplemental dopants are implanted prior to performing at least one of: a pre-amorphizing implant, an activation anneal.

12. The method of claim 11, further comprising performing a second implanting of supplemental dopants into a top layer of the semiconductor material above the melt depth prior to performing the pulsed laser anneal.

13. A method of forming a non-planar transistor, the method comprising:
    forming on a substrate a non-planar semiconductor fin including a channel region;
    forming raised source/drains, wherein the forming further comprises:
        depositing a first semiconductor layer on regions of the fin disposed on opposite sides of the channel region; and
        depositing a second semiconductor layer on the first semiconductor layer; and
        performing a pulsed laser anneal of the raised source/drains to melt the second semiconductor material layer without melting the first semiconductor layer.

14. The method of claim 13, wherein the first semiconductor layer comprises silicon and second semiconductor layer comprises GaAs.

15. The method of claim 13, further comprising performing at least one of: a furnace thermal anneal, a rapid thermal anneal, a microwave anneal, a flash anneal, or a sub-melt laser anneal to activate dopants disposed in the first semiconductor layer prior to performing the pulsed laser anneal.

16. The method of claim 15, further comprising implanting supplemental dopants into the first and second semiconductor layers prior to the anneal, the method further comprising performing a second implanting of supplemental dopants into the second semiconductor layer above the melt depth prior to performing the pulsed laser anneal but after the anneal.

17. The method of claim 13, further comprising implanting supplemental dopants into the first and second semiconductor layers prior to performing the pulsed laser anneal.

* * * * *